United States Patent [19]
Lee

[11] Patent Number: 5,801,920
[45] Date of Patent: Sep. 1, 1998

[54] POSITIONING DEVICE FOR COMPUTER READ-WRITE DEVICES

[76] Inventor: Guiy Shing Lee, No.4, Alley 104, Hualian City, Taiwan

[21] Appl. No.: 874,555

[22] Filed: Jun. 13, 1997

[51] Int. Cl.$^6$ .............................. G06F 1/16; G11B 33/02; H05K 7/14

[52] U.S. Cl. .................. 361/685; 361/726; 248/220.31; 248/224.8

[58] Field of Search ............... 364/708.1; 361/683–685, 361/725–727, 732, 740, 801; 312/223.2, 330.1; 248/220.31, 224.8

[56] References Cited

U.S. PATENT DOCUMENTS 5,599,080  2/1997  Ho .................................... 361/685 X
5,682,291  10/1997  Jeffries et al. ......................... 361/685

*Primary Examiner*—Michael W. Phillips
*Attorney, Agent, or Firm*—Pro-Techtor International Services

[57] ABSTRACT

A positioning device for computer read-write devices including a slightly bulging block with a central threaded hole at one of the side walls of a housing having a space for receiving a read-write device. Two ends of the slightly bulging block corresponding to positioning threaded holes at the sides of the read-write device are provided with respective through holes. A fastening plate with two bent ends is further provided. When the read-write device is slid along slide rails of the space into the space and positioned therein, two fastening ends of the fastening plate may pass through the through holes into the positioning threaded holes of the read-write device and be positioned. A screw is then passed through a central hole of the fastening plate into the central threaded hole of the slightly bulging block so that a disk drive may move to lie against the other side and hence position the read-write device. The invention provides easy, quick, and simple installation and removal of the read-write device.

3 Claims, 4 Drawing Sheets

POSITIONING DEVICE FOR COMPUTER READ-WRITE DEVICES

BACKGROUND OF THE INVENTION (a) Field of the Invention:

The present invention relates generally to a positioning device for computer read-write devices, and more particularly to a positioning device which allows for easy, quick and simple installation and removal of read-write devices.

(b) Description of the Prior Art:

In general, spaces are reserved in computers for receiving read-write devices such as floppy disk drives, hard disk drives, and optical disk drives. For mounting such read-write devices in the computer, generally, a plurality of horizontal plate-like slide rails are punched during molding at the side walls of the receiving space of the computer housing, so that read-write devices may be slid into the receiving spaces. Four screws are then used to pass from the outer walls of the housing into preformed holes and into the disk drive itself to lock it in position. One disadvantage is that it is necessary to remove the outer cover plate of the housing and loosen the screws before the read-write device may be removed.

In order to eliminate such a disadvantage, manufacturers have developed read-write devices with symmetrical shuttle rails for sliding along the slide rails of the housing into the receiving space. However, although this configuration has eliminated use of screws, the cost is higher, and it requires skill in operation.

SUMMARY OF THE INVENTION

Accordingly, a primary object of the present invention is to provide a positioning device for read-write devices which allows for easy, simple and quick installation or removal of a single or juxtaposed read-write devices, in which only a single screw is used to position the read-write devices.

In order to achieve the above object, the present invention comprises a slightly bulging block with a central threaded hole at one of the side walls of a housing having a space for receiving a read-write device. Two ends of the slightly bulging block corresponding to positioning threaded holes at the sides of the read-write device are provided with respective through holes. A fastening plate with two bent ends is further provided. When the read-write device is slid along slide rails of the space into the space and positioned therein, two fastening ends of the fastening plate may pass through the through holes into the positioning threaded holes of the read-write device and be positioned. A screw is then passed through a central hole of the fastening plate into the central threaded hole of the slightly bulging block so that a disk drive may move to lie against the other side and hence position the read-write device.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
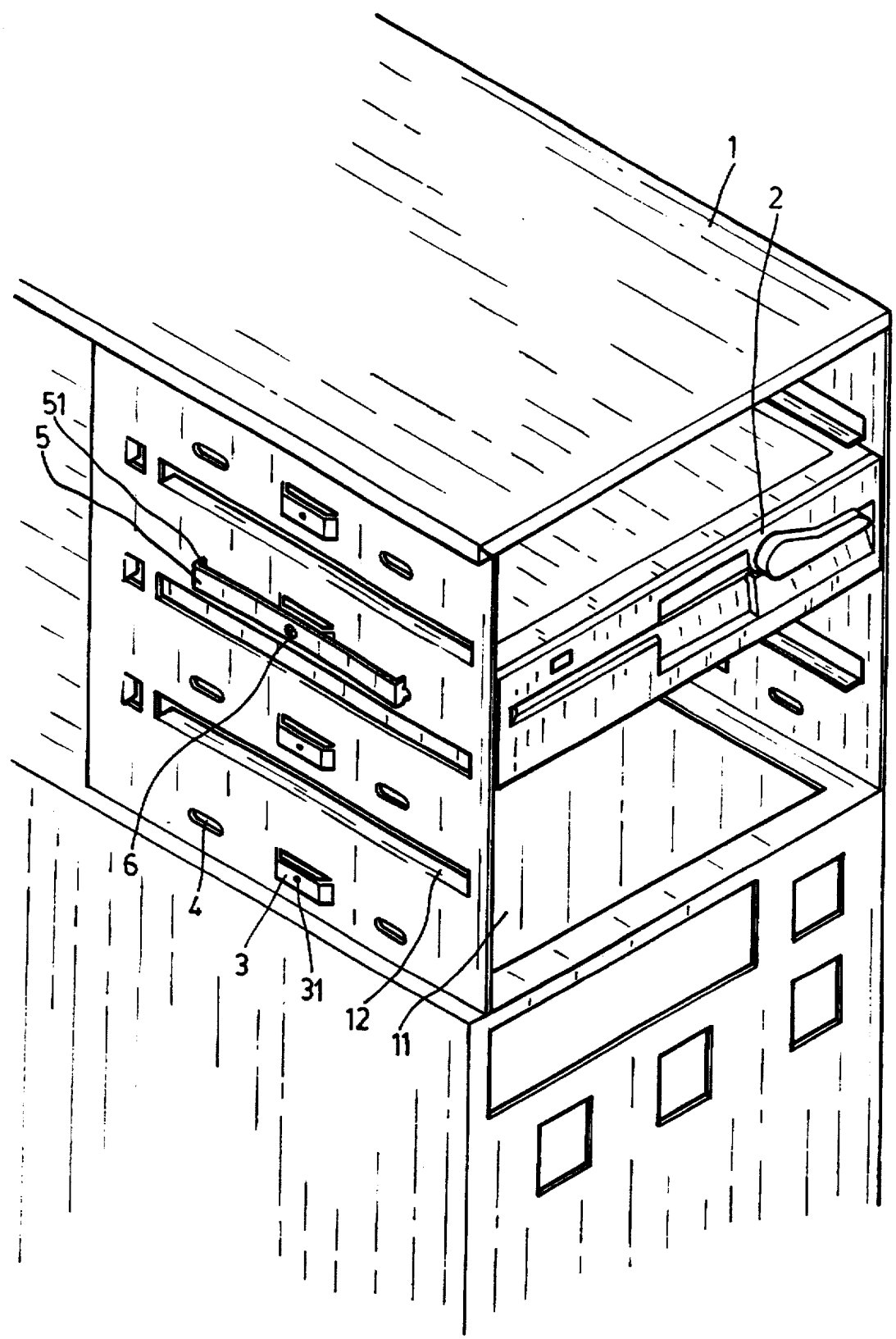
FIG. 1 is an elevational outer view of a preferred embodiment of the present invention.
Figure 2:
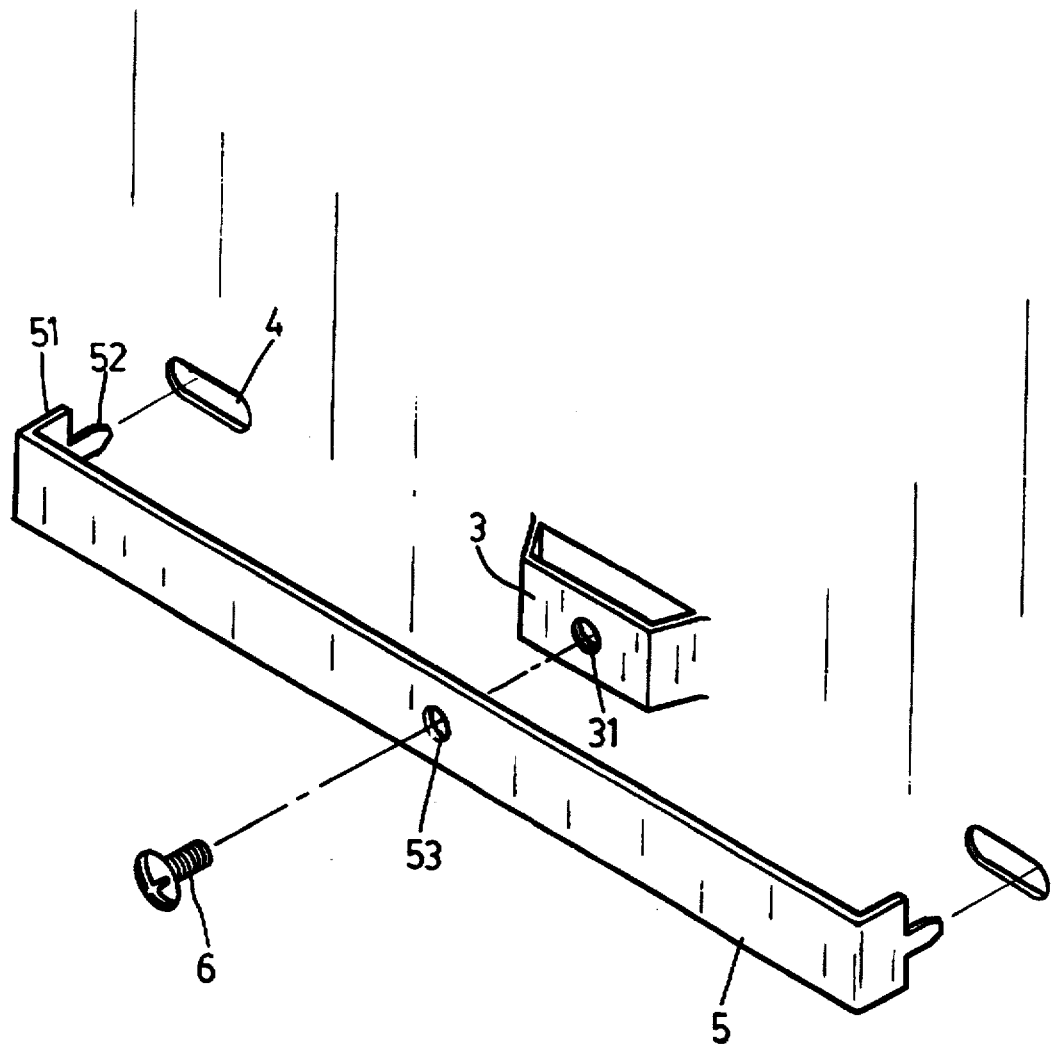
FIG. 2 is an elevational outer view of the major components of the preferred embodiment of the present invention.
Figure 3:
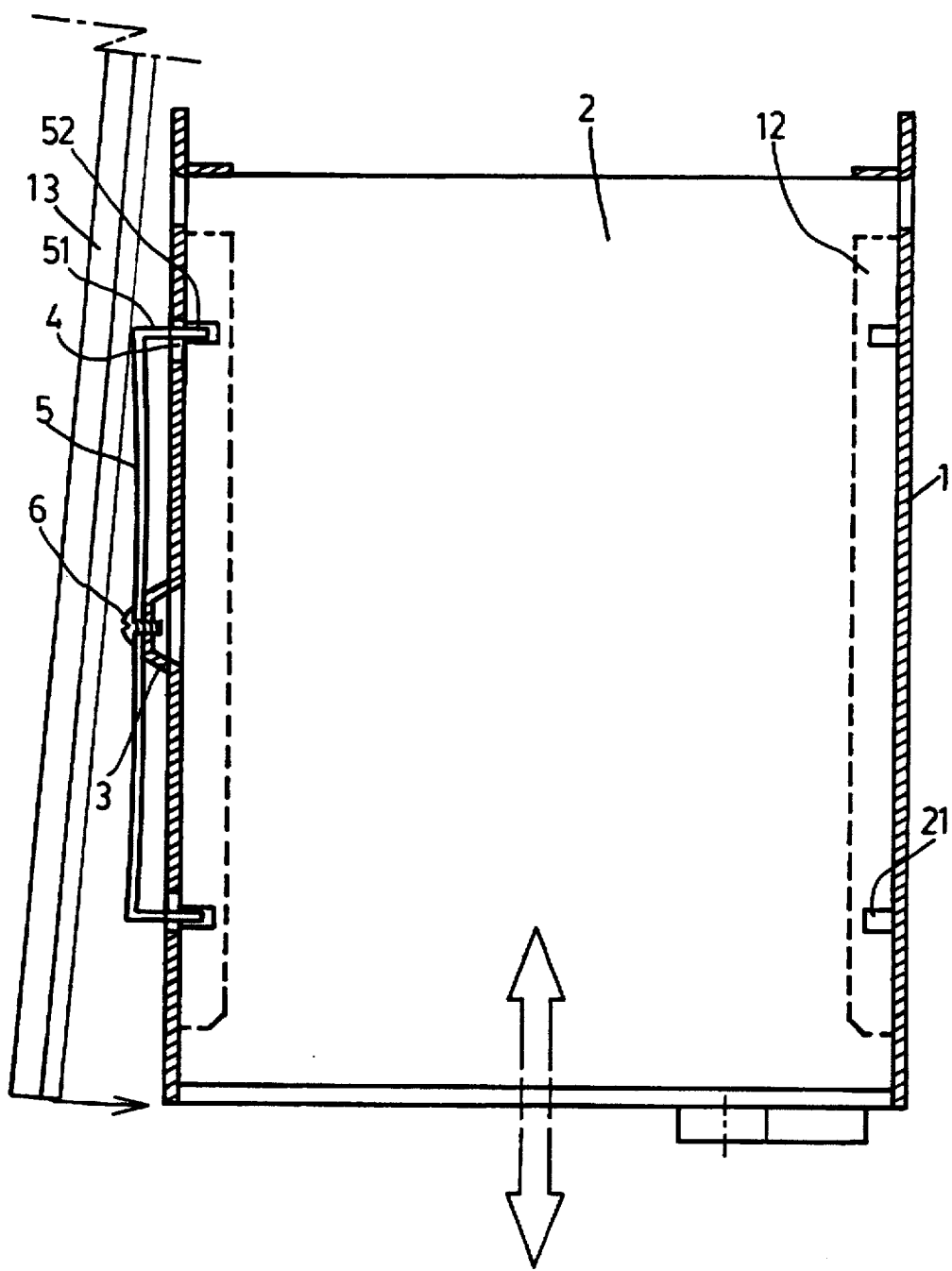
FIG. 3 is a plan schematic view of the preferred embodiment of the present invention.

As shown in FIG. 1, the structure of the present invention comprises a housing 1 with a space 11 for receiving a read-write device 2. At one of the side walls of the housing 1 is a slighting bulging block 3 with a threaded hole at its center. Two ends of the bulging block 3 corresponding to the positioning threaded holes 21 at the sides of the read-write device 2 are provided with respective through holes 4. As shown in FIG. 2, there is provided a fastening plate 5 with two bent ends 51. After the read-write device 2 is slid into the space 11 along slide rails 12 at the edges of the space 11, two fastening ends 52 of the fastening plate 5 are passed through the through holes 53 into the positioning threaded holes 21 of the read-write device 2. A screw 6 is used to pass through a central hole 53 of the fastening plate 5 into the threaded hole 31 of the bulging block 3, so that the disk drive may move to lie against the other side and hence effectively position the read-write device, as shown in FIG. 3. In use, the housing 1 is provided with a rotatable side plate 13 at the side with the bulging block 3. In this way, there is no need to open the entire outer cover plate of the housing as in the prior art.

Figure 4:
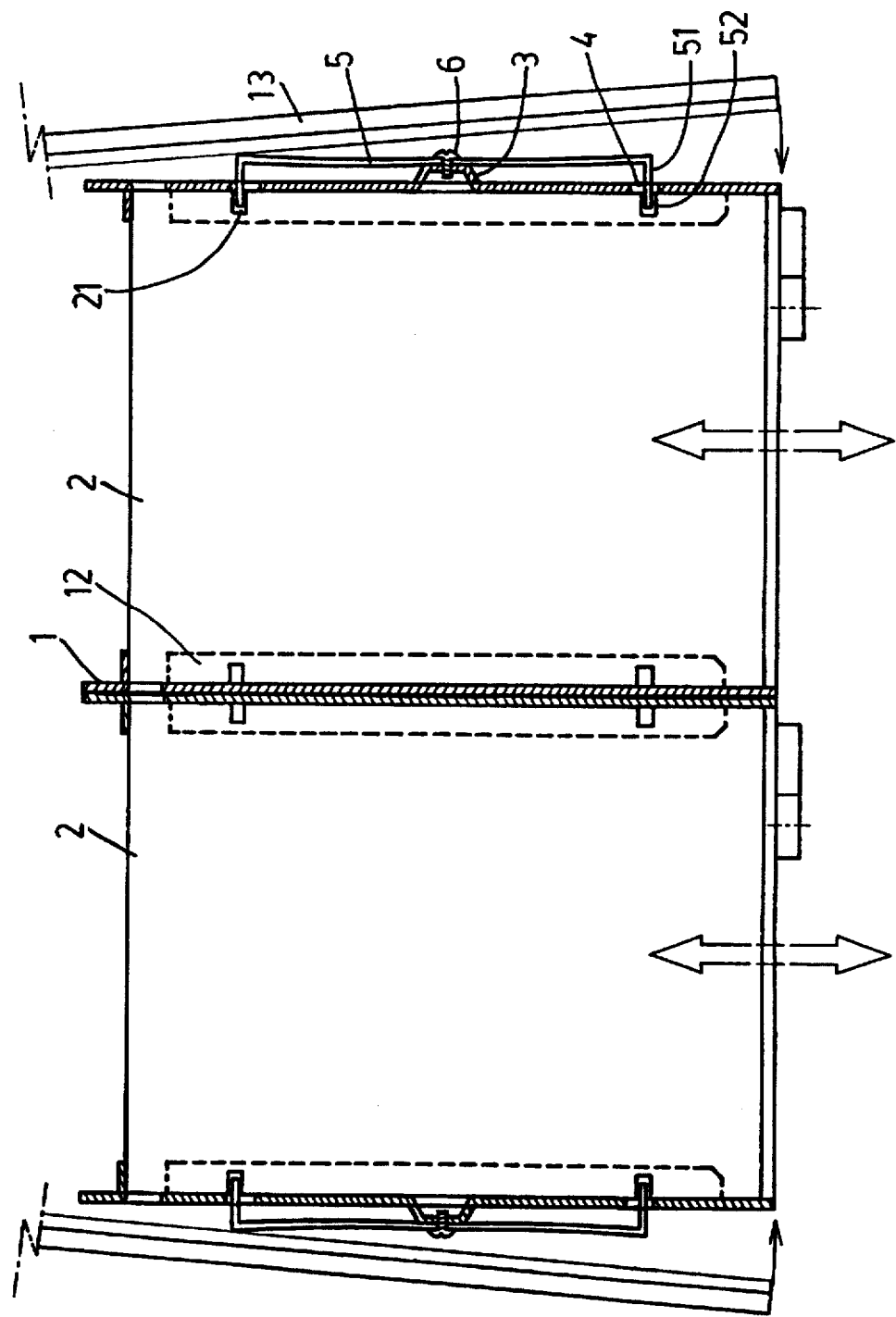
FIG. 4 illustrates application of the present invention for positioning two juxtaposed read-write devices.

As shown in FIG. 4, if the read-write devices 2 are designed to lie in a juxtaposed relationship, i.e., the spaces 11 are juxtaposed, their contiguous sides will lie close to each other, so that it is possible to operate a screw into the contiguous areas. In the present invention, two outer sides of the housing are provided with the slightly bulging blocks, and operation may be accomplished by use of a screw at one side of the housing. Thus, the present invention provides easy and quick installation and removal of read-write devices, and simple operation.

Although the present invention has been illustrated and described with reference to the preferred embodiment thereof, it should be understood that it is in no way limited to the details of such embodiment but is capable of numerous modifications within the scope of the appended claims.

What is claimed is:

1. A positioning device for computer read-write devices, said positioning device comprises a slightly bulging block with a central threaded hole at one of the side walls of a housing having a space for receiving a read-write device, two ends of said slightly bulging block corresponding to positioning threaded holes at the sides of said read-write device being provided with through holes; and a fastening plate with two bent ends such that when the read-write device is slid along slide rails of said space into said space and positioned therein, fastening ends at two ends of said fastening plate may pass through said through holes into said positioning threaded holes of said read-write device and be positioned, and a screw is passed through a central hole of said fastening plate into said central threaded hole of said slightly bulging block so that a disk drive may move to lie against the other side and hence position the read-write device, accomplishing easy, quick, and simple installation and removal of the read-write device.

2. A positioning device as claimed in claim 1, wherein said housing has a rotatable side plate at that side with said slightly bulging block.

3. A positioning device as claimed in claim 1, wherein two slightly bulging blocks are provided at two outer side walls of said space, and said housing is provided with two rotatable side plates at the corresponding side walls so that said housing may receive two juxtaposed read-write devices.

* * * * *